United States Patent
Robson et al.

(10) Patent No.: US 9,728,668 B2
(45) Date of Patent: Aug. 8, 2017

(54) INTEGRATED PHOTOSENSITIVE FILM AND THIN LED DISPLAY

(71) Applicant: Raytheon Company, Waltham, MA (US)

(72) Inventors: Michael H. Robson, Albuquerque, NM (US); Michael T. Pace, Albuquerque, NM (US)

(73) Assignee: RAYTHEON COMPANY, Waltham, MA (US)

(*) Notice: Subject to any disclaimer, the term of this patent is extended or adjusted under 35 U.S.C. 154(b) by 230 days.

(21) Appl. No.: 14/172,352

(22) Filed: Feb. 4, 2014

(65) Prior Publication Data
US 2015/0221807 A1    Aug. 6, 2015

(51) Int. Cl.
    *G09G 3/3208*     (2016.01)
    *H01L 31/18*      (2006.01)
    *H05K 1/02*       (2006.01)

(52) U.S. Cl.
CPC ........... *H01L 31/18* (2013.01); *H05K 1/0286* (2013.01); *H05K 2201/0112* (2013.01); *H05K 2201/0209* (2013.01); *H05K 2201/10106* (2013.01); *Y02B 20/346* (2013.01); *Y02P 70/521* (2015.11)

(58) Field of Classification Search
CPC ..... H01L 31/18; H01L 31/173; H01L 25/048; H01L 27/1443; H01L 121/76823; H01L 21/76823; G09G 3/3208; G03F 1/144; G03F 1/26; G03G 5/0507
USPC .......... 313/504, 506, 507, 169.3; 315/169.3; 174/68.1–136; 430/5, 34–35, 56, 430/311–322; 378/34; 257/291, 665
See application file for complete search history.

(56) References Cited

U.S. PATENT DOCUMENTS

| | | | |
|---|---|---|---|
| 4,751,513 A | 6/1988 | Daryoush et al. |
| 4,777,456 A | 10/1988 | Andrikian et al. |
| 4,835,500 A | 5/1989 | Sequeira |

(Continued)

FOREIGN PATENT DOCUMENTS

| | | |
|---|---|---|
| EP | 1345419 B1 | 11/2009 |
| EP | 1753084 B1 | 8/2011 |

(Continued)

OTHER PUBLICATIONS

Korala et al., "Transparent conducting films of CdSe(ZnS) core (shell) quantum dot xerogels", Chem. Commun. vol. 48, 2012, pp. 8523-8525.

(Continued)

*Primary Examiner* — Kenneth Parker
*Assistant Examiner* — Young W Kim
(74) *Attorney, Agent, or Firm* — Cantor Colburn LLP

(57) ABSTRACT

A system to configure a conductive pathway and a method of forming a system of configurable conductivity pathways are described. The system includes a photosensitive layer that becomes conductive based on photoexcitation, and a light source layer deposited over the photosensitive layer, the light source layer selectively providing the photoexcitation to the photosensitive layer. The system further includes a controller to control the light source layer, the controller illuminating a portion of the light source layer corresponding with a user input image to photoexcite the photosentive layer and configure the conductive pathway in the photosensitive layer according to the image.

11 Claims, 5 Drawing Sheets

(56) References Cited

U.S. PATENT DOCUMENTS

| | | | |
|---|---|---|---|
| 5,099,214 A | 3/1992 | Rosen et al. | |
| 5,481,232 A | 1/1996 | Wu et al. | |
| 5,514,499 A * | 5/1996 | Iwamatsu | G03F 1/26 378/34 |
| 5,761,351 A | 6/1998 | Johnson | |
| 5,834,147 A * | 11/1998 | Nagae | G03G 5/0507 430/56 |
| 6,274,916 B1 | 8/2001 | Donath et al. | |
| 6,313,803 B1 | 11/2001 | Manasson et al. | |
| 6,483,480 B1 | 11/2002 | Sievenpiper et al. | |
| 6,646,525 B2 | 11/2003 | Bozler et al. | |
| 7,271,877 B2 | 9/2007 | Fries | |
| 7,466,269 B2 | 12/2008 | Haziza | |
| 8,142,688 B2 | 3/2012 | Kobayashi et al. | |
| 8,279,122 B2 | 10/2012 | Landon et al. | |
| 8,298,905 B2 * | 10/2012 | Ito | H01L 21/76823 257/665 |
| 8,373,609 B1 | 2/2013 | Dorsey et al. | |
| 8,384,426 B2 | 2/2013 | Or-Bach | |
| 8,557,642 B2 | 10/2013 | Schroder et al. | |
| 2002/0043927 A1* | 4/2002 | Kimura | G09G 3/3208 313/504 |
| 2002/0085390 A1 | 7/2002 | Kiyomoto et al. | |
| 2004/0067431 A1 | 4/2004 | Arney et al. | |
| 2004/0234270 A1 | 11/2004 | Nishie et al. | |
| 2005/0139867 A1 | 6/2005 | Saito et al. | |
| 2006/0222889 A1 | 10/2006 | Kobayashi et al. | |
| 2008/0136337 A1* | 6/2008 | Rogojevic | H01L 25/048 315/169.3 |
| 2010/0040987 A1 | 2/2010 | Temchenko et al. | |
| 2010/0233874 A1 | 9/2010 | Ito | |
| 2013/0141295 A1 | 6/2013 | Jiang et al. | |
| 2014/0168751 A1 | 6/2014 | Suzuki et al. | |
| 2015/0144380 A1 | 5/2015 | Yang et al. | |
| 2015/0219855 A1 | 8/2015 | Robson et al. | |
| 2015/0222019 A1 | 8/2015 | Robson et al. | |
| 2015/0222966 A1 | 8/2015 | Robson et al. | |

FOREIGN PATENT DOCUMENTS

| | | |
|---|---|---|
| EP | 2575211 A1 | 4/2013 |
| WO | 0120718 A1 | 3/2001 |

OTHER PUBLICATIONS

Lilly et al., "Switchable photoconductivity of quantum dot films using cross-linking ligands with light-sensitive structures", Journal of Material Chemistry, vol. 21, No. 31, Aug. 21, 2011, pp. 11441-11652.

Mentzel et al., "Nanopatterned Electrically Conductive Films of Semiconductor Nanocrystals", Nano Letters 12, No. 8, Aug. 8, 2012, pp. 1-18.

* cited by examiner

INTEGRATED PHOTOSENSITIVE FILM AND THIN LED DISPLAY

BACKGROUND

The present disclosure relates to switchable conductivity. In many applications, mechanical supports are used for electrical connections. For example, a printed circuit board (PCB) provides mechanical support for the electrical connections between components. The PCB includes conductive traces that are placed onto an insulating substrate. The form of each conductive trace is fixed after the design is complete, while the function of the traces can be controlled using discrete components such as switches. Jumper wires may be added to implement the alternate routing as an alternative, but these connections can become loose and affect the integrity of the conductive traces such that only pathways that were anticipated during the design and layout phase of the PCB are practicable.

SUMMARY

According to one embodiment, a system to configure a conductive pathway includes a photosensitive layer configured to become conductive based on photo excitation; a light source layer deposited over the photosensitive layer, the light source layer configured to selectively provide the photoexcitation to the photosensitive layer; and a controller configured to control the light source layer, the controller illuminating a portion of the light source layer corresponding with a user input image to photoexcite the photosentive layer and configure the conductive pathway in the photosensitive layer according to the image.

According to another embodiment, a method of forming a system of configurable conductivity pathways includes disposing a photosensitive layer on a mechanical support; depositing a light source layer on the photosensitive layer; and configuring a controller to control the light source layer to configure a photoconductive pathway in the photosensitive layer that corresponds with an input image.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As noted above, when alternative conductive paths (e.g., electrical connections, radio frequency pathways) are needed, they must be pre-placed and additional components, such as switches, must be included to facilitate any change in connectivity. For example, when a PCB is fabricated, the placement of the components and the connections between them are planned, and the connectivity paths between components are deposited. These connectivity paths carry the current from one component to another, for example. During operation of the circuit, if the connectivity paths need to be changed to modify the circuit for any reason, the change is possible if the PCB was fabricated with the additional connectivity paths as well as switches that facilitate the change. If no such additional paths and switching elements were implemented during fabrication of the PCB, the PCB must be modified to facilitate the change. Embodiments of the system and method detailed herein relate to dynamically configurable conductivity paths based on optically switchable elements. These switchable connectivity paths do not require pre-planning or additional components like switches. The system and method discussed herein apply to any surface or mechanical support with conductive traces or paths (e.g., circuit board, radome lining).

Additional embodiments described herein relate specifically to a system and method to selectively illuminate and thereby selectively excite (initiate conductivity of) the optically switchable elements. Additionally, embodiments of the interface and arrangement detailed below facilitate stacking of devices that include the optically switchable elements.

Figure 1:
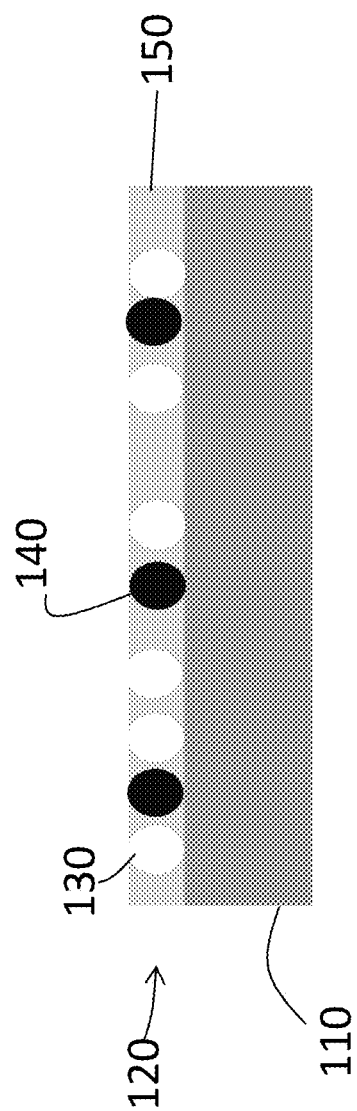
FIG. 1 is a cross-sectional view of a device with configurable conductivity paths according to an embodiment of the invention.

FIG. 1 is a cross-sectional view of a device with dynamically configurable conductivity pathways according to an embodiment of the invention. The embodiment shown in FIG. 1 includes a substrate 110 to mechanically support a photosensitive layer 120 with the configurable conductivity paths, but the exemplary embodiment does not limit the mechanical supports and shapes contemplated for the device. The substrate 110 is non-conductive and may be a dielectric layer. While the photosensitive layer 120 is shown as being deposited over one entire surface of the substrate 110 in FIG. 1, the photosensitive layer 120 may be deposited over at least a portion of at least one side of the substrate 110. The photosensitive layer 120 includes at least one type of optical switching element (OSE) 130, and may also include at least one type of field transmission element (FTE) 140, and one or more types of an immobilizing material (IM) 150. When the IM 150 is present, the OSE 130 and FTE 140 are fillers in the IM 150, which is the body of the film making up the photosensitive layer 120. The IM 150 is made from a material or a blend of materials that are transparent to high energy photons and provides mechanical and environmental stability to the fillers (OSE 130 and FTE 140). For example, the IM 150 may be a polymethyl methacrylate (PMMA), poly isobutylene (PIB), or poly ether imide (PEI). When the IM 150 is present, the filling factor must be sufficiently high for the fillers (OSE 130 and FTE 140) to be in electrical contact with one another but must also be sufficiently low such that the integrity of the resulting film is upheld. A ratio of FTE 140 to OSE 130 is material-dependent. A lower ratio (increasingly more OSE 130 than FTE 140) provides for higher resolution of conductive features when the photosensitive layer 120 is illuminated but higher transparency (radio frequency transparency) when the photosensitive layer 120 is not illuminated, while a higher ratio (increasingly more FTE 140 than OSE 130) provides for higher conductivity when the photosensitive layer 120 is illuminated and lower transparency (radio frequency transparency) when the photosensitive layer 120 is not illuminated.

The OSE 130 is a nanostructured semiconductor material that is sensitive to high energy photons. For example, the OSE 130 may include quantum dots (IIB-VIA, IVA-VIA, or IIIA-VA), vanadium oxide ($VO_2$), silicon nanoparticles, a semiconducting polymer, or other semiconducting material. The OSE 130 material can be induced to an electrically conductive state by the absorption of the photon. That is, when a light source illuminates the OSE 130, causing photoexcitation, the illuminated OSE 130 becomes conductive. Accordingly, a path of OSE 130 material may be illuminated to define a conductivity path within the photosensitive layer 120. The structure of the OSE 130 includes one or more materials that passivate the surface of the OSE 130 and thereby alter the material properties of the OSE 130. The FTE 140 is an inherently conductive nanostructured material. For example, the FTE 140 may include silver, copper, or gold nanoparticles (or another intrinsically conductive material) and may define the nano-particulate equivalent of a transmission line. Exemplary materials that may be used as FTE 140 (and may also be used as passivating material or IM 150) include poly(3,4-ethylenedioxythiophene) poly(styrenesulfonate) (PEDOT:PSS), polyaniline (PANI), and poly(3-hexylthiophene) (P3HT). The FTE 140 may also include one or more passivating materials. These passivating materials may or may not be the same as the passivating materials in the structure of the OSE 130. Exemplary passivating materials include n-butylamine (n-But), ethanedithiol (EDT), and ethanediamine (EDA).

Figure 2:
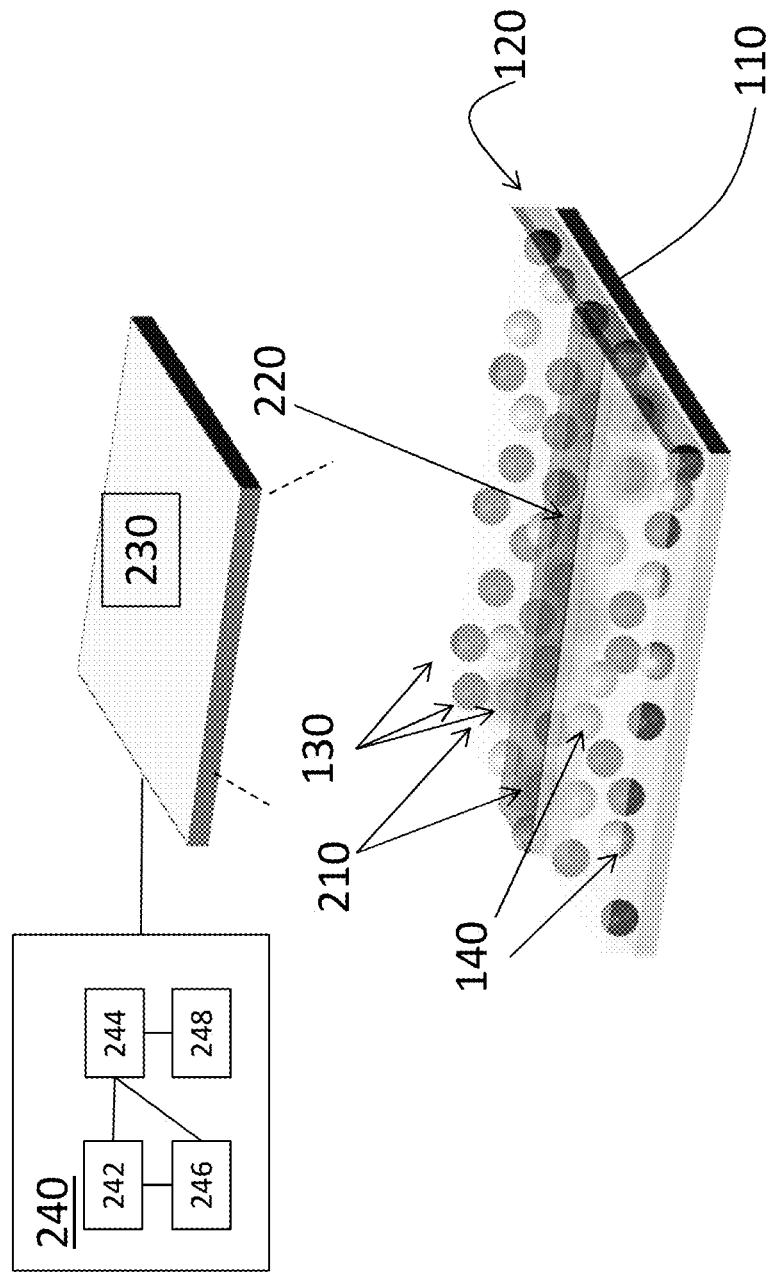
FIG. 2 shows a system to dynamically configure a conductive pathway according to an embodiment of the invention.

FIG. 2 shows a system to dynamically configure a conductive pathway according to an embodiment of the invention. As noted with reference to FIG. 1, the exemplary arrangement of the photosensitive layer 120 on the substrate 110 is not intended to limit the arrangement of the device. Both the OSE 130 and FTE 140 are shown as part of the photosensitive layer 120. The OSE 130 that are illuminated by a light source 230 (e.g., ultraviolet light, x-ray, visible, or other high energy light) are indicated by 210. While the light source 230 is shown separated from the photosensitive layer 120 in FIG. 2 for clarity, the light source 230 may be disposed directly on the photosensitive layer 120 to accurately control the areas of the photosensitive layer 120 that are illuminated. In alternate embodiments, backlighting or projection may be used to illuminate the OSE 130. A controller 240 may be used to control the light source 230. The controller 240 includes an input interface 242 (e.g., keyboard, output of another circuit), one or more processors 244, one or more memory devices 246, and an output interface 248 that outputs the signal to control the light source 230. The OSE 130 (210) that is illuminated forms conductive layers while the unilluminated OSE 130 (dark regions) are insulating. The specific regions that are conductive or that create conductive pathways between components when the device shown in FIG. 2 is incorporated in a circuit, for example, can be altered dynamically by changing the pattern of illumination. Thus, without apriori knowledge of conductive paths needed in the device, for example, the illumination by the light source 230 may be adjusted to dynamically form the conductivity path in the photosensitive layer 120.

Figure 3:
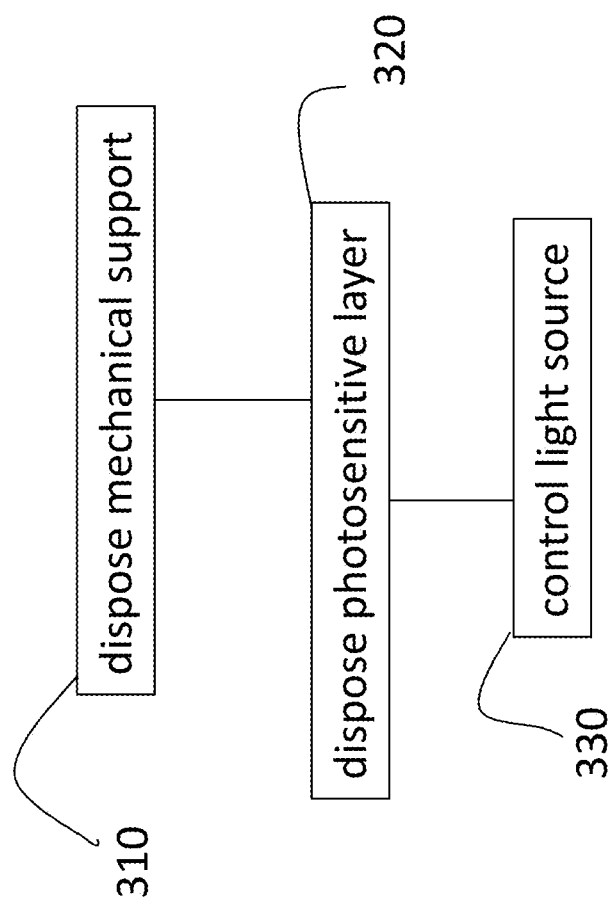
FIG. 3 is a process flow of a method of forming a dynamically configurable conductivity pathway according to an embodiment of the invention.

FIG. 3 is a process flow of a method of forming a dynamically configurable conductivity pathway according to an embodiment of the invention. At block 310, disposing a mechanical support includes disposing a substrate 110 for a circuit, for example. As noted above, the mechanical support may be any non-conductive surface on which the photosensitive layer 120 may be disposed. The mechanical support may be a radome, for example. At block 320, disposing the photosensitive layer 120 includes depositing the photosensitive layer 120 on at least part of at least one side of the mechanical support. As detailed above, the photosensitive layer 120 may include OSE 130 and FTE 140 that may be fillers in an IM 150. Controlling a light source 230 at block 330 facilitates changing conductivity of the OSE 130 in the photosensitive layer 120 to dynamically configure conductivity paths.

Figure 4:
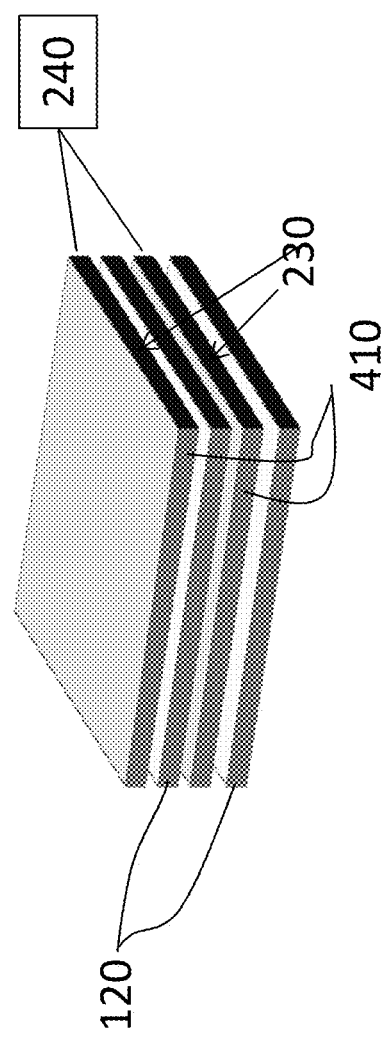
FIG. 4 shows a stacked system of dynamically switchable conductivity pathways according to an embodiment of the invention.

As noted above, additional embodiments relate specifically to selectively illuminating OSE 130 using an arrangement that facilitates stacking of devices that have the dynamically switchable conductivity pathways. FIG. 4 shows a stacked system of devices including dynamically switchable conductivity pathways according to an embodiment of the invention. Although shown with gaps between the layers in FIG. 4 for clarity, the layers may be disposed directly on top of one another. The exemplary system shown in FIG. 4 includes two photosensitive layers 120 (which may each be supported by a substrate 110), each with a corresponding light source 230 that is a layer of LEDs 410. The layer of LEDs 410 is used as one example, but a bulk semiconductor layer, layer of organic LEDs (OLEDs), or layer of quantum dots may be used, as well. Each layer of LEDs 410 may be controlled by one or more controllers 240. Specifically, the input interface 242 of the controller 240 may be a graphical user interface (GUI) that facilitates an input of the portions of the photosensitive layer 120 to be illuminated (photoexcited) based on selecting pixels of LEDs 410 among the layer of LEDs 410 for illumination. A user selects an image through the GUI, and the image is superimposed via photoexcitation by the LEDs 410 on the OSE 130 within an area of the photosensitive layer 120 corresponding with the image. The selected LEDs 410 emit ultraviolet light, for example, to photoexcite the corresponding OSE 130 in the photosensitive layer 120. The selected LEDs 410 may alternatively emit visible light. Because the light source 230 (layer of LEDs 410) is disposed on the respective photosensitive layer 120, as shown in FIG. 4, rather than arranged at a distance or for backlighting, for example, the light source 230 need not be the top layer. Instead, another device which may include another photosensitive layer 120 can be stacked above the layer of LEDs 410. As is clear from FIG. 4, any number of devices may be stacked in the manner illustrated by FIG. 4.

Figure 5:
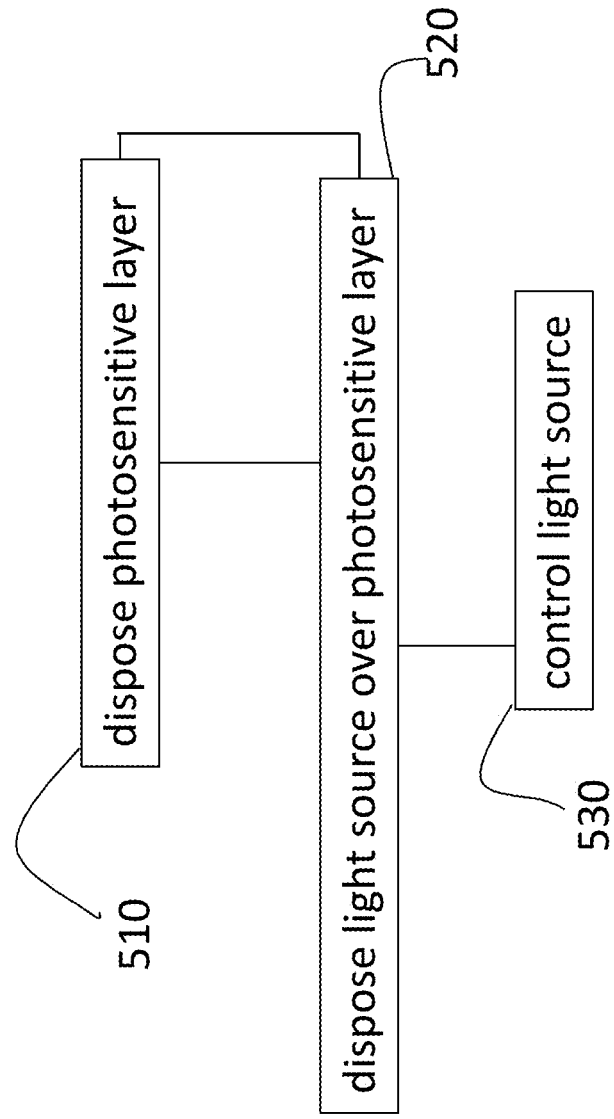
FIG. 5 is a process flow of a method of forming a system of configurable conductivity pathways according to an embodiment of the invention.

FIG. 5 is a process flow of a method of forming a system of configurable conductivity pathways according to an embodiment of the invention. In particular, a system of stacked devices with configurable conductivity pathways may be formed according to embodiments of the invention. At block 510, disposing a photosensitive layer 120 may be over a mechanical support like a substrate 110. At block 520, disposing a light source 230 over the photosensitive layer 120 includes disposing a layer of LEDs 410 directly over the photosensitive layer 120. Blocks 510 and 520 may be repeated to stack multiple devices including a photosensitive layer 120 and a layer of LEDs 410. At block 530, controlling the light source 230 includes using a controller 240. The same or a different controller 240 may be used for each layer of LEDs 410. The input interface 242 of the controller 240 may include a GUI that facilitates the input of an image by a user. The controller 240 then imposes that image, in the form of illuminated LEDs 410 among the layer of LEDs 410, onto the photosensitive layer 120.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a system of configurable conductivity pathways, the method comprising:
   disposing a photosensitive layer on a mechanical support;
   disposing a light source layer on the photosensitive layer; and
   configuring a controller to control two or more light emitting diodes (LEDs) of the light source layer to illuminate portions of the photosensitive layer corresponding with an image to configure a photoconductive pathway along a plane of the photosensitive layer corresponding with the portions, the photoconductive pathway being configured only during illumination by the light source layer.

2. The method according to claim 1, further comprising coupling a graphical user interface to the controller, the graphical user interface configured to facilitate input of the image.

3. The method according to claim 1, wherein the disposing the photosensitive layer includes disposing optical switching elements that conduct when photoexcited.

4. The method according to claim 3, wherein the configuring the controller includes configuring the controller to illuminate a portion of the light source layer matching a portion of the optical switching elements corresponding with the image.

5. The method according to claim 1, wherein the disposing the light source layer includes disposing a light source to controllably emit ultraviolet light or visible light.

6. The method according to claim 1, further comprising disposing a second photosensitive layer on the light source layer.

7. The method according to claim 6, further comprising depositing a second light source layer over the second photosensitive layer.

8. The method according to claim 7, further comprising configuring a second controller to control the second light source layer to configure conductive pathways in the second photosensitive layer.

9. The method according to claim 8, wherein the second controller and the controller are a same controller.

10. The method according to claim 1, wherein the disposing the photosensitive layer includes disposing a photoconductive element and a conductive element in electrical contact with one another within an immobilizing material.

11. The method according to claim 1, wherein the disposing the light source layer includes depositing a layer of light emitting diodes (LEDs), a bulk semiconductor layer, a layer of quantum dots, or a layer of organic LEDs (OLEDs).

* * * * *